United States Patent [19]

Ebihara

[11] Patent Number: 5,753,535
[45] Date of Patent: May 19, 1998

[54] LEADFRAME AND RESIN-SEALED SEMICONDUCTOR DEVICE

[75] Inventor: Kazumi Ebihara, Satsuma-gun, Japan

[73] Assignee: Fujitsu Limited, Kawasaki, Japan

[21] Appl. No.: 314,269

[22] Filed: Sep. 30, 1994

Related U.S. Application Data

[62] Division of Ser. No. 945,713, Sep. 16, 1992, Pat. No. 5,367,191.

[30] Foreign Application Priority Data

Sep. 18, 1991 [JP] Japan ................................. 3-237952

[51] Int. Cl.$^6$ ........................ H01L 21/48; H01L 21/56; H01L 21/60
[52] U.S. Cl. ................................. 437/217; 437/220
[58] Field of Search .................... 257/676, 667, 257/669, 739; 437/220, 217

[56] References Cited

U.S. PATENT DOCUMENTS

| | | | |
|---|---|---|---|
| 4,200,969 | 5/1980 | Aoyama et al. | 29/577 R |
| 4,707,724 | 11/1987 | Suzuki et al. | 357/71 |
| 4,942,452 | 7/1990 | Kitano et al. | 257/676 |
| 5,221,428 | 6/1993 | Ohsawa et al. | 257/666 |
| 5,354,422 | 10/1994 | Kato et al. | 437/220 |

FOREIGN PATENT DOCUMENTS

| | | |
|---|---|---|
| 63-132466 | 6/1988 | Japan . |
| 63-213362 | 9/1988 | Japan . |
| 63-239967 | 10/1988 | Japan . |
| 1129448 | 5/1989 | Japan . |
| 1-154545 | 6/1989 | Japan . |
| 1147836 | 6/1989 | Japan . |
| 54-100676 | 8/1989 | Japan . |
| 2129948 | 5/1990 | Japan . |
| 3-188656 | 8/1991 | Japan . |
| 3-188657 | 8/1991 | Japan . |
| 3-188658 | 8/1991 | Japan . |
| 3-188659 | 8/1991 | Japan . |
| 3-188660 | 8/1991 | Japan . |
| 3-188656 | 8/1992 | Japan . |
| 5129512 | 5/1993 | Japan . |

OTHER PUBLICATIONS

Patent Abstracts of Japan, vol. 13, No. 18 (E-704) Jan. 17, 1989 & JP-A-63 224245 (Hitachi Ltd) Sep. 19, 1988.
Patent Abstracts of Japan, vol. 14, No. 51, (E-881) Jan. 30, 1990 & JP-A-1 278055 (Shinko Electric Ind Co Ltd) Nov. 8, 1989.
Patent Abstracts of Japan, vol. 15, No. 139 (E-1053) Apr. 9, 1991 & JP-A-3 018048 (Matsushita Electron Corp) Jan. 25, 1991.
Patent Abstracts of Japan, vol. 15, No. 394 (E-1119) Oct. 7, 1991 & JP-A-3 159163 (Shinko Electric Ind Co Ltd) Jul. 9 1991.
Patent Abstracts of Japan, vol. 15, No. 428 (E-1128) Oct. 30, 1991 & JP-A-3 179768 (Hitachi Metals Ltd) Aug. 5, 1991.
Patent Abstracts of Japan, vol. 15, No. 444 (E-1132) Nov. 12, 1991 & JP-A-3 188658 (Toppan Printing Co Ltd) Aug. 16, 1991.
Patent Abstracts of Japan, vol. 14, No. 568 (E-1014) Dec. 18, 1990 & JP-A-2 246359 (Fujitsu Ltd) Oct. 2, 1990.

*Primary Examiner*—David Graybill
*Attorney, Agent, or Firm*—Staas & Halsey

[57] ABSTRACT

Process for manufacturing a leadframe that is adapted to enhance the adhesion between a stage 1 and a sealing resin without decreasing the bonding strength between the stage 1 and a chip 4; and a semiconductor device constructed by using such a leadframe. The leadframe comprises a body 1 constructed from at least two kinds of layer members, 11, 12, and 13, formed from different materials and laminated one on top of the other; the materials for the layer members 11, 12, and 13 being chosen to have different etching rates. Hollow spaces 15 are formed inside the layer member having the greatest etching rate of all the layer members.

9 Claims, 6 Drawing Sheets

×200

×200

×200

×200

LEADFRAME AND RESIN-SEALED SEMICONDUCTOR DEVICE

This application is a division, of application Ser. No. 07/945,713, filed Sep. 16, 1992, U.S. Pat. No. 5,367,191.

BACKGROUND OF THE INVENTION

1. Field of the Invention

The present invention relates to a leadframe, and more particularly to a leadframe for a resin-sealed semiconductor device.

2. Description of the Related Art

As shown in FIG. 9, a conventional type of leadframe 1, 1' is typically constructed in a single layer structure using a single material such as a copper (Cu)-based material or an iron-nickel (Fe-Ni) alloy (generally known as "Alloy 42" because of the 42% nickel contained therein). In the illustrated construction, a chip 4 containing a semiconductor integrated circuit is mounted on the upper principal surface of a stage 1 of the leadframe with a conductive adhesive, such as silver (Ag) paste, intervening therebetween for bonding one to the other; after a pad 7 forming a terminal on the chip 4 is connected to a lead 1' of the leadframe (the tip of the lead 1' is plated with silver (Ag) or the like) using an appropriate lead wire such as gold wire, an appropriate sealing resin 2 is molded to encapsulate the stage 1 of the leadframe, the chip 4, and a portion of each lead 1'. A resin-sealed semiconductor device is thus formed.

In a semiconductor device using a leadframe of the above construction, adhesion between the chip and the leadframe and between the leadframe and the sealing resin becomes a problem; while the bonding strength at the interface between the leadframe and the chip has been improved by the improvement of adhesives, the bonding strength at the interface between the resin 2 and the leadframe, and in particular stage 1 thereof, is not yet sufficient, and an improvement in the bonding strength is required.

Specifically, if the bonding strength at the interface between stage 1 and resin 2 is weak, imperfections such as voids, cracks, and gaps may be initially contained in the interface, or such voids, cracks, gaps, etc. may be further developed or expanded when stress is applied to the semiconductor device.

In particular, if such voids, cracks, gaps, etc. are formed in the interface, there is a possibility that water or moisture initially contained in resin 2 and, furthermore, external water or moisture subsequently absorbed into resin 2, will build up in the voids, cracks, gaps, etc. The resulting problem is that when mounting the semiconductor device on a circuit board, the high temperature of soldering (e.g., 215° to 260° C.) used in the process will cause the water or moisture to expand in volume, thereby expanding the voids, etc. and thus forming cracks in the semiconductor device.

To overcome the above problem, the prior art has employed a method that involves providing through holes in stage 1 of the leadframe. This method, however, results in a significant reduction in the bonding effect since the conductive adhesive, such as silver paste or solder, enters the through holes when the chip 4 is mounted on the stage 1. The method also involves a reduction in the bonding strength between stage 1 and the chip 4 because of the reduced bonding area between them.

SUMMARY OF THE INVENTION

It is an object of the present invention to provide a leadframe that overcomes the above-described shortcomings of the prior art and that improves the bonding strength between stage 1 and the sealing resin without reducing the bonding strength between stage 1 and the chip 4.

It is another object of the invention to provide a semiconductor device constructed using such a leadframe.

To achieve the above objects, the present invention employs the technical constitution described below. In a first preferred aspect of the present invention, there is provided a leadframe that comprises a body constructed from at least two kinds of layer members formed from different materials and laminated one on top of the other, the materials for the layer members being chosen to have different respective etching rates. In a second preferred aspect of the present invention, there is provided a leadframe wherein openings are formed through one layer member and independent hollow spaces communicating with the openings are formed in another layer member. In a third preferred aspect of the present invention, there is provided a resin-sealed semiconductor device that is constructed by sealing, in a resin material, the above structured leadframe with an appropriate chip mounted thereon, the sealing resin being made to spread into the hollow spaces through the openings formed on the opposite side of the leadframe from the side thereof on which the chip is mounted.

Since the leadframe of the present invention has the above-described construction, during the molding process the sealing resin is made to spread into the hollow spaces formed in the side of the leadframe stage opposite the chip-mounting side thereof, thereby providing an anchor effect and thus enhancing the adhesion, and hence the bonding strength, at the interface between the resin and the leadframe and, in particular, the stage thereof.

Furthermore, since no through holes are formed in the upper chip-mounting surface of the leadframe stage, the leadframe of the present invention allows the use of adhesives having lower viscosity than that of the adhesives previously used, and thus makes it easier to use such conductive adhesives as silver paste or solder, thereby enhancing the uniformity and efficiency of the stage-to-chip bonding work and also improving the adhesion between the stage and the resin without reducing the bonding strength between the stage and the chip.

DETAILED DESCRIPTION OF THE PREFERRED EMBODIMENTS

The preferred embodiments of the present invention will now be described in detail with reference to the accompanying drawings.

Figure 1:
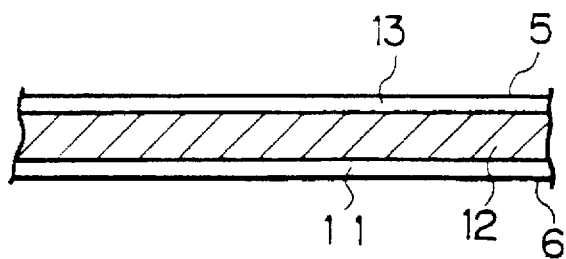
FIG. 1 is a cross sectional view showing the structure of a leadframe according to one embodiment of the invention.

FIG. 1 is a cross sectional view showing the structure of a leadframe according to one embodiment of the invention. The leadframe in the example shown has a three-layer structure.

In FIG. 1, the leadframe comprises a body 1 constructed from at least two kinds of layer members 11, 12, and 13, formed from respective, different materials and laminated one on top of the other. The materials forming the layer members 11, 12, and 13, are chosen so as to have different respective etching rates.

Here, it is assumed that the uppermost layer member 13, as shown in FIG. 1, forms the principal surface of the leadframe on which a chip is to be mounted. The layer member 11 is hereinafter referred to as the first layer member, the layer member 12 forming an intermediate processing layer as the second layer member, and the layer member 13 being the third layer member.

In the above structure, each individual layer member is made of a material selected to have a different etching rate than that of each of the other layers. In one example, the etching rate of the second layer member is chosen to be the greatest, followed by that of the first layer member, and the etching rate of the third layer member is chosen to be the smallest of the three.

In another example, the first and third layer members can be made to have equal, i.e., common, etching rates as between them, but a rate which is smaller than that of the second layer member, the etching rate of the second layer member thus being the greatest of the three.

In the present invention, the etching rate of each individual layer member can be varied by appropriately changing the material of the layer member.

For example, since the etching rate of a copper (Cu)-based material is greater than that of iron-nickel (Fe-Ni) alloy, the above etching rate scheme can be accomplished by forming the second layer member from a copper-based material and the first and third layer members from an iron-nickel alloy.

Next, in accordance with the present invention, the second layer member 12 having a prescribed etching rate, the first layer member 11 having an etching rate smaller than that of the second layer member, and/or the third layer member 13 having an etching rate smaller than that of the second layer member 12 but equal to or greater than that of the first layer member, are prepared, and these layer members are deposited and joined together by using suitable joining means to provide the structure shown in FIG. 1.

In the present invention, the first layer member 11 may be pre-formed with a prescribed number of through holes 14, opened therein at a prescribed pitch or, alternatively, the layered structure shown in FIG. 1 may be formed first, and then the through holes may be opened through the first layer member 11.

Figure 2:
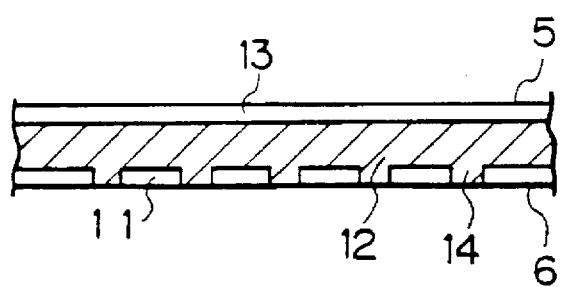
FIG. 2 is a cross sectional view showing an example wherein through holes are formed in a first layer member of the leadframe of the invention.

In the latter case and as shown in FIG. 2, during the rolling operation for joining the first layer member 11 to the second layer member 12, part of the material forming the second layer member 12 penetrates into the through holes formed in the first layer member 11.

Also, in the present invention, the through holes 14 do not have to be made in the first layer member 11 but, instead, may be patterned on the first layer member 11 for etching, using a mask or the like having therein suitable openings, so that the through holes 14 are opened (i.e., formed) by etching the first layer member 11.

The shape of the through holes 14 is not specifically limited and any desired shape, e.g., circular, polygonal, or oval, of through holes may be used.

Also, the cross sectional area of the through holes 14 is not specifically limited, but since there is a need to form a large number of independent hollow spaces inside the second layer member 12, as will be described later, it is preferable to determine the cross sectional area in relationship to the material of the second layer member 12, the etching rate of the material, the kind of etchant used, etc.

Next, in the present invention, etching is performed on the thus constructed leadframe 1 of the three-layer structure thereby to form, inside the second layer member 12, independent hollow spaces 15 that communicate with the respective through holes 14 formed in the first layer member 11.

An etchant of ferric chloride, for example, may be chosen as the etchant for use in the present invention.

Figure 3:
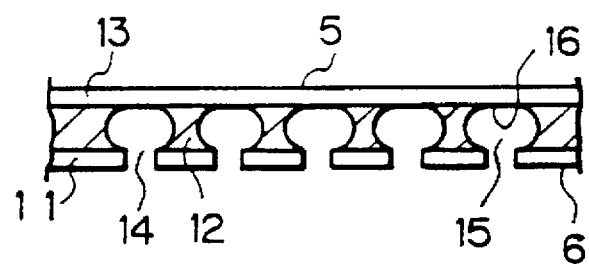
FIG. 3 is a cross sectional view showing an example of the structure of the leadframe of the invention.

In the present invention, during the etching process, the second layer member 12 in the leadframe is etched preferentially to the first layer member 11, so that hollow spaces 15 are formed independently of each other, as shown in FIG. 3, corresponding to the respective through holes 14 formed in the first layer member 11.

Therefore, in the present invention, the etching condition should be selected to avoid etching the whole second layer member 12 or forming large hollow spaces 15 covering more than one through hole 14.

Also, in the present invention, the size of the hollow spaces 15 formed inside the second layer member 12 is not specifically limited; the top 16 of each hollow space 15 may reside within the second layer member 12 or, alternatively, the etching may be performed in such a way that the top 16 of each hollow space 15 reaches the third layer member 13, as shown in FIG. 3.

Figure 4:
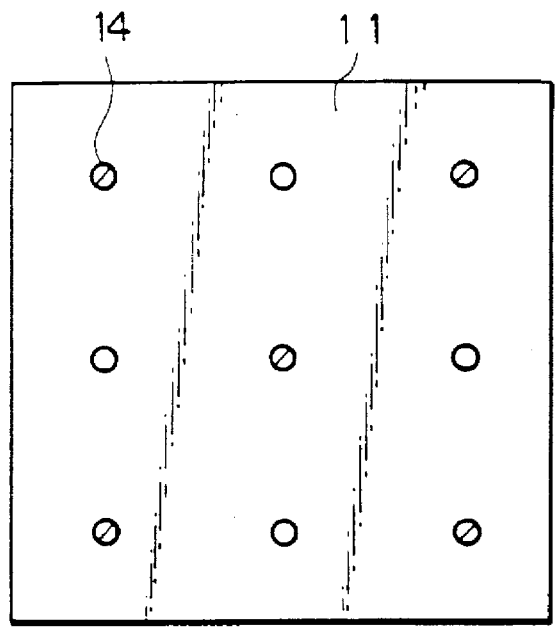
FIG. 4 is a bottom plan view of the leadframe of the invention.
Figure 5:
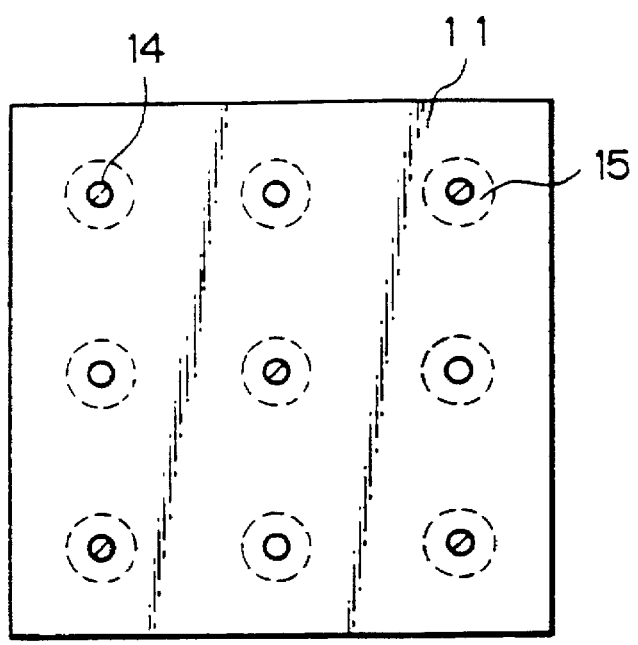
FIG. 5 is a bottom plan view of the leadframe of the invention.

FIGS. 4 and 5 respectively show the bottom surface of the first layer member 11 before and after the etching is performed in accordance with the present invention.

Furthermore, in the present invention, a resin-sealed semiconductor device is constructed using the leadframe of the invention; first, an appropriate chip is attached in place on the principal surface 5 of the stage of the leadframe by using an appropriate adhesive, and then an appropriate sealing resin is molded around the leadframe-chip subassembly, to complete the construction of a resin-sealed semiconductor device.

Figure 6:
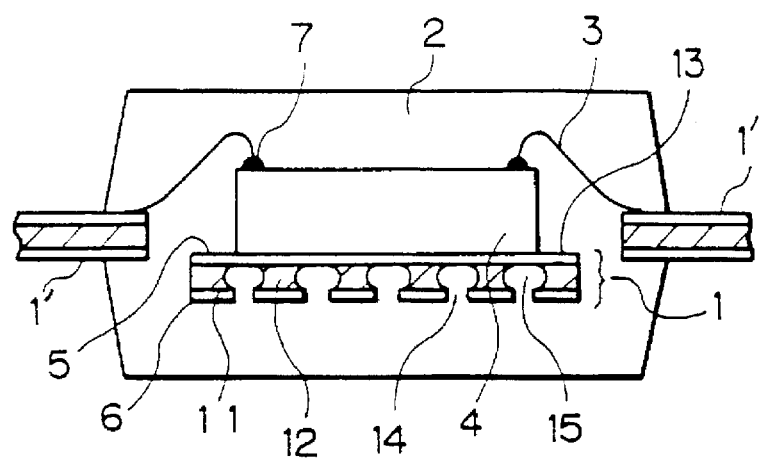
FIG. 6 is a cross sectional view showing an example of a resin-sealed semiconductor device constructed using the leadframe of the invention.

FIG. 6 shows an example of the structure of the semiconductor device constructed using the leadframe of the invention.

Figure 9:
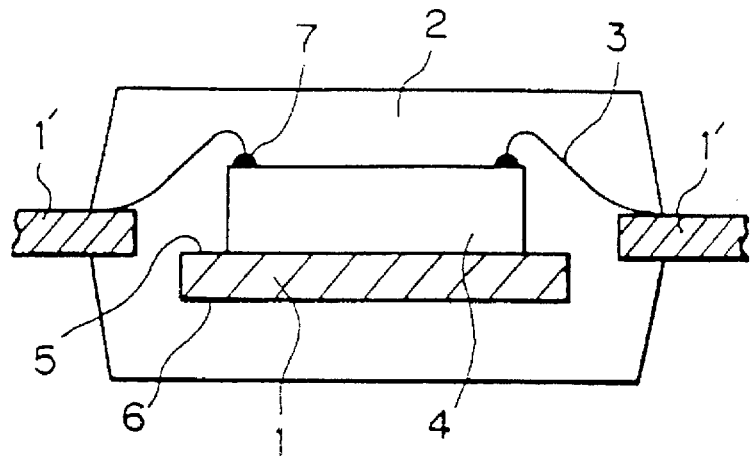
FIG. 9 is a cross sectional view showing, as an example, the structure of a prior art resin-sealed semiconductor device.

In FIG. 6, the same reference numerals are used to designate the same parts as those in FIG. 9.

Since the present invention requires the use of more than one layer member to construct the leadframe, at least two kinds of layer members having different etching rates should be used to construct the layer structure, though it is also possible to use four or more kinds of layer members.

Therefore, as an alternative embodiment of the leadframe of the invention, a leadframe constructed with two layers will be described below with reference to FIGS. 7 and 8.

Figure 7:
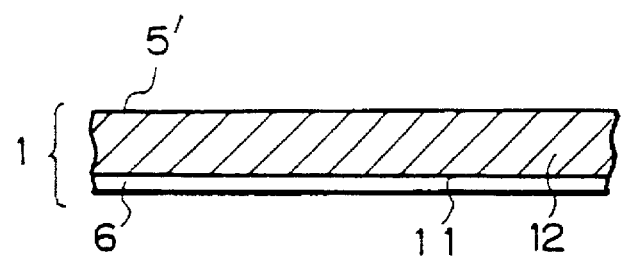
FIG. 7 is a cross sectional view showing the structure of a leadframe according to another embodiment of the invention.

FIG. 7 shows the leadframe 1 of the invention which comprises only the first layer member 11 and the second layer member 12 corresponding to those shown in FIG. 1.

In this embodiment, the etching rate of the second layer member 12 is chosen to be greater than that of the first layer member 11.

The materials of the above layer members 11 and 12 can be selected appropriately, based on the same principle as described in connection with FIG. 1.

In this embodiment, the upper surface 5' of the second layer member 12 serves as the principal surface on which to mount a chip 4. Furthermore as in the foregoing embodiment, the first layer member 11 is provided with appropriate through holes 14 opened therein as shown in FIG. 4.

After the leadframe 1 is fabricated by joining the two layer members 11 and 12 together, the same etching process as previously described is performed so that the second layer member 12 of the leadframe is etched preferentially, relatively to the first layer member 11; as a result, a large number of individually independent hollow spaces 15 is formed inside the second layer member 12 in correspondence with the respective through holes 14 formed in the fist layer member 11, in the same manner as shown in FIG. 3.

Figure 8:
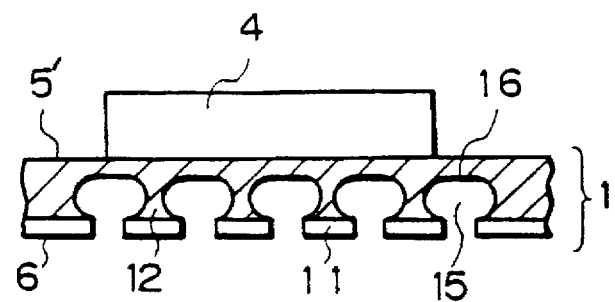
FIG. 8 is a cross sectional view showing the structure of a leadframe according to another embodiment of the invention.

In this embodiment of FIGS. 7 and 8, however, the etching condition is selected so that each hollow space 15 is not etched through the entirety of the second layer member 12 until the top 16 thereof communicates with (i.e., is disposed at) the chip-mounting principal surface 5'.

Except for the etching condition, the same conditions as for the foregoing embodiment of FIG. 3 are employed for this embodiment of FIG. 8.

Next, the advantages of the leadframe of the invention will be described below, with reference to FIG. 12 and in comparison with a leadframe constructed in accordance with the prior art method discussed below with reference to FIG. 10.

First, as an example of the prior art leadframe, a leadframe A of 0.15 mm thickness was made using only Alloy 42, i.e., iron-nickel alloy; as an example of the leadframe of the invention, a leadframe B of a three-layer structure was constructed by attaching Alloy 42 layers 11 and 13, each 0.05 mm thick, on both sides of a central layer 12 of 0.05 mm thick copper (Cu) sheeting.

Etching was performed on the leadframes A and B with an etching solution composed primarily of ferric chloride, the results of which are shown, variously, in FIGS. 10 through 13.

Figure 10:
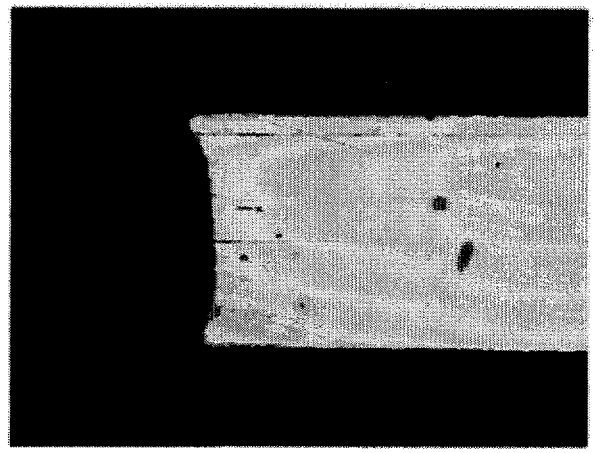
FIG. 10 is a diagram showing a cross sectional profile of an end portion of a prior art leadframe A treated with complete etching.
Figure 12:
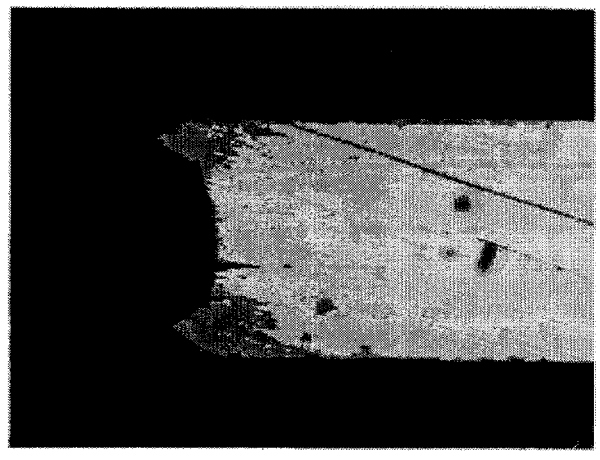
FIG. 12 is a diagram showing a cross sectional profile of an end portion of a leadframe B of the present invention, with complete etching.

FIGS. 10 and 12 show cross sectional profiles of end portions of the respective leadframes A and B formed as a result of complete etching; FIG. 10 shows a cross sectional profile of an end portion of the prior art leadframe A with the complete etching, and FIG. 12 shows a cross sectional profile of an end portion of the leadframe B, of the present invention, with the complete etching.

When FIGS. 10 and 12 are compared, it can be seen that the second, center portion 12 was etched at a faster rate than the first and third layers 11 and 13 in the case of the leadframe B constructed according to the present invention.

Figure 11:
FIG. 11 is a diagram showing a cross sectional profile of the prior art leadframe A treated with half etching.
Figure 13:
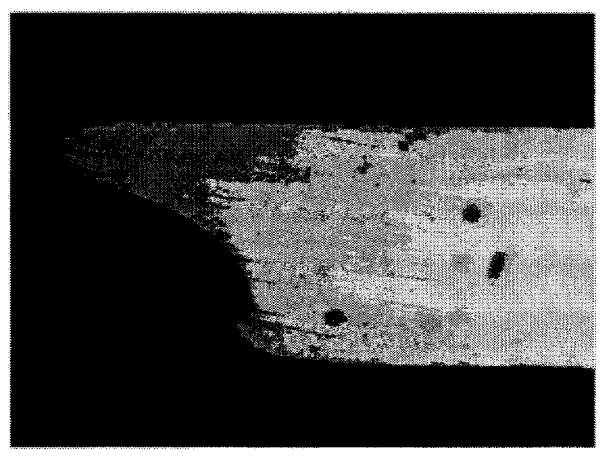
FIG. 13 is a diagram showing a cross sectional profile of the leadframe B of the present invention, with half etching.

FIGS. 11 and 13 show cross sections of portions of the leadframes A and B after etching was performed under (i.e., from the bottom surfaces) of the leadframes A and B, as shown in the figures; the etching process was stopped at an appropriate point halfway through the etching, i.e., a so-called half etching state. FIG. 11 shows a cross sectional profile of the prior art leadframe A with half etching, and FIG. 13 shows a cross sectional profile of the leadframe B, of the present invention, with half etching.

When FIGS. 11 and 13 are compared, it can be seen that the center portion was etched at a faster rate in the case of the leadframe A constructed according to the present invention, causing the second layer member 12 to be further etched and cut inwardly.

This means that as a result of the half etching of the leadframe of the invention, a projecting edge 11' is formed at the boundary between the first Alloy 42 layer 11 and the second copper layer 12. When, for example, an epoxy resin is molded around the leadframe in a subsequent process step, the edge 11' serves as an anchor to prevent the leadframe from separating or breaking away from the molded resin, though providing an effective prevention against cracking.

Figure 14:
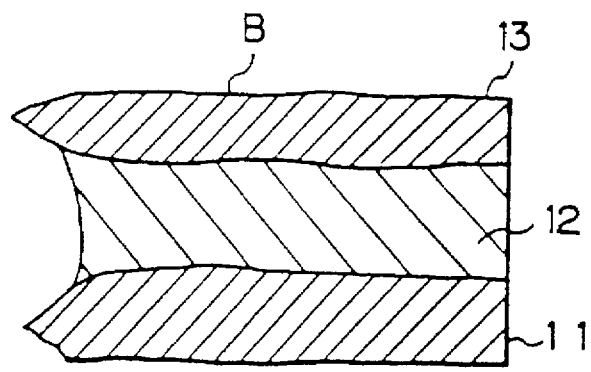
FIG. 14 is a diagram showing the conditions of the layers shown in the cross section of FIG. 12.
Figure 15:
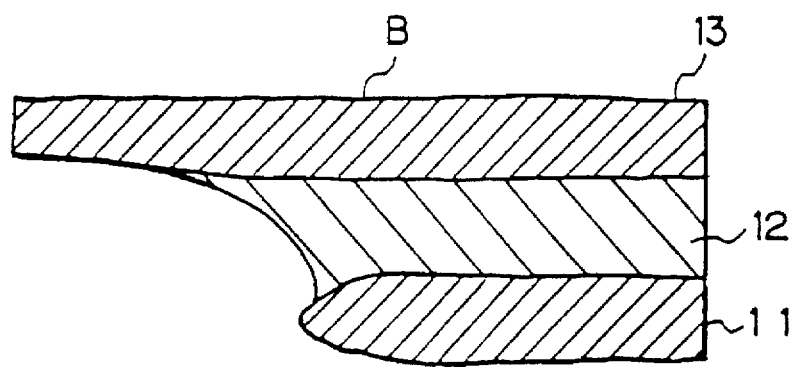
FIG. 15 is a diagram showing the conditions of the layers shown in the cross section of FIG. 13.

FIG. 14 is a diagram explaining the conditions of the layers shown in the cross section of FIG. 12, and FIG. 15 is a diagram explaining the conditions of the layers shown in cross section of FIG. 13.

Table 1 shows the results of experiments conducted on the leadframe B of the invention and the leadframe A of the prior art to observe how cracking occurs.

In Experiment No. 1, the leadframe B having the structure of the invention, but not processed with half etching, was mounted with a prescribed number of devices and then encapsulated in a molded epoxy resin, after which the completed assembly was dried for 24 hours at a temperature of 125° C. and then exposed to a humid environment of 85° C. temperature and 85% humidity for 12 hours or 24 hours. The, after the leadframe B was immersed in molten solder of 260° C. for 10 seconds, the resulting chip was visually inspected at randomly selected positions a prescribed number of times to check for the formation of cracks, and to count the number of cracks formed.

As a result, in Experiment No. 1, when the moisture absorption time was set at 12 hours, cracks were observed at seven positions out of the 10 positions observed, while on the other hand, after 24 hours of moisture absorption, cracks were observed at eight positions out of the 10 positions.

In Experiment No. 2, the leadframe B of the invention was treated with half etching to produce a leadframe equivalent to the embodiment of the invention, i.e., the leadframe having the cross section shown in FIG. 13. The thus prepared leadframe B was mounted with a prescribed number of devices and then encapsulated in a molded epoxy resin, after which the same processing as in the above Experiment No. 1 was performed and the same observations were conducted.

As a result, in Experiment No. 2, when the moisture absorption time was set at 12 hours, no cracks were observed at any of the 10 positions observed, while on the other hand, after 24 hours of moisture absorption, cracks were observed only at six positions out of the 10 positions.

In Experiment No. 3, the leadframe A of the prior art was treated with half etching, after which the same processing as above was performed and the same observations were conducted.

As a result, in Experiment No. 3, when the moisture absorption time was set at 12 hours, cracks were observed at eight positions out of the 10 positions observed, while on the other hand, after 24 hours of moisture absorption, cracks were observed at all of the 10 positions.

It is apparent from the above experiments that even if the leadframe A of the prior art is treated with the half etching, the separation or gapping between the molded resin and the leadframe can easily occur since no projections that serve as anchors are formed between them.

On the other hand, in the case of the leadframe of the invention, it can be seen that the projections effectively serve as anchors so that there is little possibility of the bond between the molded resin and the leadframe breaking away or separating and resulting in the formation of cracks.

TABLE 1

| No. | Material | Half etching | Moisture absorption time (H) 85° C..85% RH (Relative Humidity) | Package cracks/ Sample size |
| --- | --- | --- | --- | --- |
| 1 | Leadframe B | None | 12 | 7/10 |
|   |   |   | 14 | 8/10 |
| 2 | Leadframe B | Half etching | 12 | 0/10 |
|   |   |   | 24 | 6/10 |
| 3 | Leadframe A | Half etching | 12 | 8/10 |
|   |   |   | 24 | 10/10 |

With the above described construction, the leadframe of the present invention achieves an improvement in the adhesion between the stage of the leadframe and the sealing resin without reducing the bonding strength between the stage of the leadframe and the chip, and thus contributes to enhancing the reliability of semiconductor devices containing semiconductor integrated circuits.

I claim:

1. A method of forming a lead frame, comprising the steps of:

forming a plurality of leads; and forming a stage, the step of forming the stage including the substeps of:

separately providing at least a first layer member formed of a first material and a second layer member formed of a second material, the first and second layer members each having opposing upper and lower surfaces;

joining the upper surface of the first layer member to the lower surface of the second layer member, at least the first and second layer members forming a multi-layered lead frame body having a chip-mounting top surface and a bottom surface, the lower surface of the first layer member defining the bottom surface of the lead frame body;

etching the multi-layered lead frame body, from the bottom surface thereof and while protecting the chip-mounting top main surface from the etching, utilizing an etchant having a lower etching rate in the first material than in the second material, so as to etch a plurality of spaced openings through the first layer and, in succession, to etch and thereby form a plurality of individual hollow cavities within said second layer respectively corresponding to and communicating with the plurality of openings in the first layer, the corresponding interior dimensions of the hollow cavities being greater than the corresponding interior dimensions of the respective openings in the first layer; and limiting the extent of the etching into the second layer so as to prevent the cavities from extending through the upper surface of the second layer.

2. A method of forming a lead frame as recited in claim 1, wherein the etching step further comprises forming a mask on the bottom surface of the lead frame body, the mask having openings therein through which portions of the bottom surface of the lead frame body are exposed, thereby to etch the lead frame body through the openings in the mask and thereby to form, in succession, the plurality of openings in the first layer and the respective hollow cavities in the second layer.

3. A method of forming a lead frame as recited in claim 1, further comprising the steps of:

providing a third layer member having opposing upper and lower surfaces, the etchant having a lower etching rate in the third layer member than in the second material; and joining the lower surface of the third layer member to the upper surface of the second layer member so that the upper surface of the third layer member forms the chip-mounting top surface of the multi-layered lead frame body.

4. A method of forming a lead frame as recited in claim 3, wherein the etchant has the same etching rate in the third layer member as in the first material.

5. A method of forming a lead frame as recited in claim 3, wherein the etchant has a greater etching rate in the third layer member than in the first material.

6. A method of forming a lead frame, comprising the steps of:

(a) separately providing at least a first layer member formed of a first material and a second layer member formed of a second material, the first and second layer members each having opposing upper and lower surfaces;

(b) forming a plurality of spaced openings in the first layer member extending from the upper surface to the lower surface of the first layer member;

(c) after step (b), joining the upper surface of the first layer member to the lower surface of the second layer member, at least the first and second layer members forming a multi-layered lead frame body having a chip-mounting top surface and a bottom surface, the lower surface of the first layer member defining the bottom surface of the lead frame body;

(d) etching the multi-layered lead frame body, from the bottom surface thereof and while protecting the chip-mounting top main surface from the etching, utilizing an etchant having a lower etching rate in the first material than in the second material, so as to etch a plurality of individual hollow cavities within said second layer, each hollow cavity communicating with a corresponding spaced opening in the first layer, the interior dimensions of the hollow cavities being greater than the interior dimensions of the corresponding spaced openings in the first layer; and (e) limiting the extent of the etching into the second layer so as to prevent the cavities from extending through the upper surface of the second layer.

7. A method of forming a lead frame as recited in claim 6, further comprising the steps of:

providing a third layer member having opposing upper and lower surfaces, the etchant having a lower etching rate in the third layer member than in the second material; and joining the lower surface of the third layer member to the upper surface of the second layer member so that the upper surface of the third layer member forms the chip-mounting top surface of the multi-layered lead frame body.

8. A method of forming a lead frame as recited in claim 7, wherein the etchant has the same etching rate in the third layer member as in the first material.

9. A method of forming a lead frame as recited in claim 7, wherein the etchant has a greater etching rate in the third layer member than in the first material.

* * * * *

UNITED STATES PATENT AND TRADEMARK OFFICE
CERTIFICATE OF CORRECTION

PATENT NO. : 5,753,535
DATED : May 19, 1998
INVENTOR(S) : Kazumi EBIHARA

It is certified that error appears in the above-identified patent and that said Letters Patent is hereby corrected as shown below:

Col. 8, between lines 18 and 19 (Claim 6, between lines 2 and 3), insert the following two paragraphs:
--     forming a plurality of leads; and
    forming a stage, the step of forming the stage including the substeps of;--

Signed and Sealed this

First Day of December, 1998

Attest:

BRUCE LEHMAN

*Attesting Officer*       *Commissioner of Patents and Trademarks*

UNITED STATES PATENT AND TRADEMARK OFFICE
CERTIFICATE OF CORRECTION

PATENT NO.: 5,753,535
DATED : May 19, 1998
INVENTOR(S): Kazumi EBIHARA

It is certified that error appears in the above-identified patent and that said Letters Patent is hereby corrected as shown below:

[73] Assignee: Please add --Kyushu Fujitsu Electronics Limited, Satsuma-gun, Japan--

Signed and Sealed this

Thirty-first Day of August, 1999

Attest:

Q. TODD DICKINSON

*Attesting Officer*     *Acting Commissioner of Patents and Trademarks*